United States Patent
Yamashita

(10) Patent No.: US 10,481,490 B2
(45) Date of Patent: Nov. 19, 2019

(54) IMPRINT APPARATUS, AND METHOD OF MANUFACTURING ARTICLE

(71) Applicant: CANON KABUSHIKI KAISHA, Tokyo (JP)

(72) Inventor: Keiji Yamashita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 285 days.

(21) Appl. No.: 15/345,205

(22) Filed: Nov. 7, 2016

(65) Prior Publication Data
US 2017/0129144 A1 May 11, 2017

(30) Foreign Application Priority Data
Nov. 9, 2015 (JP) ................................. 2015-219791

(51) Int. Cl.
*G03F 7/00* (2006.01)
*B29C 43/02* (2006.01)
*B29C 43/56* (2006.01)
*H01L 21/3105* (2006.01)
(Continued)

(52) U.S. Cl.
CPC ............ *G03F 7/0002* (2013.01); *B29C 33/40* (2013.01); *B29C 43/021* (2013.01); *B29C 43/56* (2013.01); *H01L 21/31058* (2013.01); *H01L 21/67092* (2013.01); *B29C 2043/025* (2013.01); *B29C 2043/566* (2013.01); *B29K 2995/0026* (2013.01)

(58) Field of Classification Search
None
See application file for complete search history.

(56) References Cited

U.S. PATENT DOCUMENTS

| | | | | |
|---|---|---|---|---|
| 5,997,963 A | * | 12/1999 | Davison | .................. C23C 16/44 118/722 |
| 6,257,866 B1 | * | 7/2001 | Fritz | ....................... B29C 51/06 425/387.1 |

(Continued)

FOREIGN PATENT DOCUMENTS

| JP | H08-128596 A | 5/1996 |
|---|---|---|
| JP | 3700001 A | 9/2005 |

(Continued)

OTHER PUBLICATIONS

Hiroshima, "Release force reduction in UV nanoimprint by mold orientation control and by gas environment", Journal of Vacuum Science and Technology, B 27(6), pp. 2862-2865, Nov./Dec. 2009.

(Continued)

*Primary Examiner* — Timothy Kennedy
(74) *Attorney, Agent, or Firm* — Canon U.S.A.Inc., IP Division

(57) ABSTRACT

An imprint apparatus performs pressing of an imprint material on a substrate with a mold to form a pattern on the substrate. The imprint apparatus includes a supply device configured to supply a condensable gas to a space between the imprint material and the mold. The condensable gas is liquefied by the pressing. The apparatus further includes a pipe for transferring the condensable gas in a gas state to the supply device and a storage connected to the pipe. The storage stores the condensable gas in a liquid state. The supply device is configured to supply the condensable gas vaporized in the storage and transferred through the pipe from the storage.

9 Claims, 3 Drawing Sheets

(51) Int. Cl.
*H01L 21/67* (2006.01)
*B29C 33/40* (2006.01)

(56) References Cited

U.S. PATENT DOCUMENTS

| | | | | |
|---|---|---|---|---|
| 8,211,214 | B2* | 7/2012 | Xu | B01D 19/0005 216/52 |
| 2007/0063384 | A1* | 3/2007 | Choi | B29C 43/003 264/319 |
| 2007/0231422 | A1* | 10/2007 | Cherala | B82Y 10/00 425/453 |
| 2012/0199997 | A1* | 8/2012 | Tanabe | G03F 7/0002 264/82 |
| 2014/0191441 | A1* | 7/2014 | Mori | B29C 59/002 264/293 |
| 2015/0123300 | A1* | 5/2015 | Tanabe | G03F 7/0002 264/40.1 |
| 2015/0123313 | A1* | 5/2015 | Tanaka | G03F 7/0002 264/293 |
| 2016/0147143 | A1* | 5/2016 | Ito | G03F 7/0002 264/447 |

FOREIGN PATENT DOCUMENTS

| | | |
|---|---|---|
| JP | 2009-052595 A | 3/2009 |
| JP | 2009-054653 A | 3/2009 |
| JP | 2011-514658 A | 5/2011 |
| JP | 2015-144315 A | 8/2015 |

OTHER PUBLICATIONS

Hiroshima, et al."Viscosity of a thin file of UV curable resin in pentafluoropropane", Journal of Photopolymer Science and Technology, vol. 23, pp. 45-50, No. 1, 2010.

* cited by examiner

IMPRINT APPARATUS, AND METHOD OF MANUFACTURING ARTICLE

BACKGROUND OF THE DISCLOSURE

Field of the Disclosure

The present disclosure relates to an imprint apparatus, and a method of manufacturing an article.

Description of the Related Art

An imprint technique is being put into practical use as one of the lithography techniques for manufacturing an article, such as a semiconductor device.

In imprint processing in the air, pressing of a resin with a mold tends to cause a bubble to be trapped between the mold and the resin. If the resin is cured while the bubble is left, a formed pattern may have an unfilled defect.

To eliminate or reduce such an unfilled defect, the time (hereinafter, "filling time") required for filling with the resin has to be set to a long time so that the mold maintains contact with the resin until the trapped air dissipates away from a shot or is dissolved in the resin. A reduction in throughput of an apparatus caused by extending the filling time is one of the disadvantages of the imprint technique.

As a measure to reduce an unfilled defect or the filling time, PCT Japanese Translation Patent Publication No. 2011-514658 discloses introduction of helium that has a high molecular diffusion rate or carbon dioxide that is readily dissolved in resin. However, further improvement is required to reduce the filling time and increase the throughput of an apparatus.

Japanese Patent No. 3700001 discloses a configuration in which a space including the whole of a substrate or an imprint processing target region is exposed to a condensable gas in order to further reduce the filling time. In this configuration, condensing the condensable gas trapped between a mold and resin can reduce the filling time and eliminate or reduce an unfilled defect. Hiroshima, Journal of Vacuum Science and Technology B 27(6) (2009), 2862-2865, reports that the use of 1,1,1,3,3-pentafluoropropane (hereinafter, simply referred to as "pentafluoropropane"), a kind of condensable gas, enables a reduction in force (hereinafter, "release force") with which a mold is separated or released from cured resin. Reducing the release force can eliminate or reduce deposition of resin on the mold, thus reducing a transfer defect. Furthermore, Hiroshima, Journal of Photopolymer Science and Technology Volume 23, Number 1 (2010), 45-50, reports a phenomenon in which the viscosity of resin is lowered by pentafluoropropane. The lower the viscosity of resin is, the easier the resin spreads over a substrate. Thus, the filling time can be reduced. In addition, Japanese Patent Laid-Open No. 2009-052595 discloses an apparatus and method for stably supplying a low vapor pressure liquefied gas, such as HF, $ClF_3$, $BCl_3$, $SiH_2$, $Cl_2$, or $WF_6$, which is used in a semiconductor factory. As described in Japanese Patent Laid-Open No. 2009-052595, to prevent the low vapor pressure liquefied gas from being liquefied in gas supply pipes, the liquefied gas is transferred in a gas state from a cylinder filled with the low vapor pressure liquefied gas to a secondary storage, the liquefied gas is reliquefied and is then vaporized in the secondary storage, and after that, the liquefied gas is supplied to the apparatus. The pipes are temperature-controlled to prevent the gas from being liquefied in the pipes.

Pentafluoropropane, a kind of condensable gas, has an effect in reducing the release force, an effect of lowering the viscosity of resin, and is useful to reduce the filling time, unfilled defects, and transfer defects. Typically, pentafluoropropane, serving as a low vapor pressure condensable gas, is stored in a liquid state in a container, the gas is vaporized in the container, and the gas is then transferred to an imprint apparatus. As regards energy to transfer the condensable gas vaporized in the container to the imprint apparatus, the vapor pressure of pentafluoropropane, or an extremely low pressure alone is used as energy. Typically, external energy produced by a pump or the like is not used. In an imprint apparatus used for a semiconductor manufacturing process, for example, a mass flow controller for precisely regulating the flow rate of pentafluoropropane and a cleaning filter are arranged in a pipe. Furthermore, a container is disposed outside a clean room in a semiconductor factory and the pipe is accordingly long. This increases a pressure loss in the pipe, causing pentafluoropropane to be liquefied in the pipe. Disadvantageously, it is difficult to stably supply the gas to the imprint apparatus. According to the method disclosed in Japanese Patent Laid-Open No. 2009-052595, the condensable gas is transferred in the gas state to the secondary storage disposed in the vicinity of the imprint apparatus, the gas is reliquefied in the secondary storage, and the gas is then transferred to the apparatus. This achieves stable supply of the condensable gas to the apparatus. However, if a cleaning filter is disposed in the pipe, it is difficult to prevent the condensable gas from being liquefied in the pipe because the filter has a high pressure loss. Unfortunately, it is difficult to stably supply the condensable gas.

SUMMARY OF THE DISCLOSURE

The present disclosure provides, for example, an advantageous technique used in transferring a condensable gas in a gas state to a supply device thereof.

An aspect of the present disclosure provides an imprint apparatus that performs pressing of an imprint material on a substrate with a mold to form a pattern on the substrate. The apparatus includes a supply device configured to supply a condensable gas to a space between the imprint material and the mold. The condensable gas is liquefied by the pressing. The apparatus further includes a pipe for transferring the condensable gas in a gas state to the supply device and a storage connected to the pipe. The storage stores the condensable gas in a liquid state. The supply device is configured to supply the condensable gas vaporized in the storage and transferred through the pipe from the storage.

Further features of the present disclosure will become apparent from the following description of exemplary embodiments with reference to the attached drawings.

DESCRIPTION OF THE EMBODIMENTS

Embodiments of the present disclosure will be described in detail below with reference to the drawings. The present disclosure is not limited to the following embodiments. These embodiments are intended to be merely illustrative, advantageous embodiments of the present disclosure. All of the combinations of features described in the following embodiments are not necessarily indispensable for implementation in accordance with an embodiment of the present disclosure.

Figure 1:
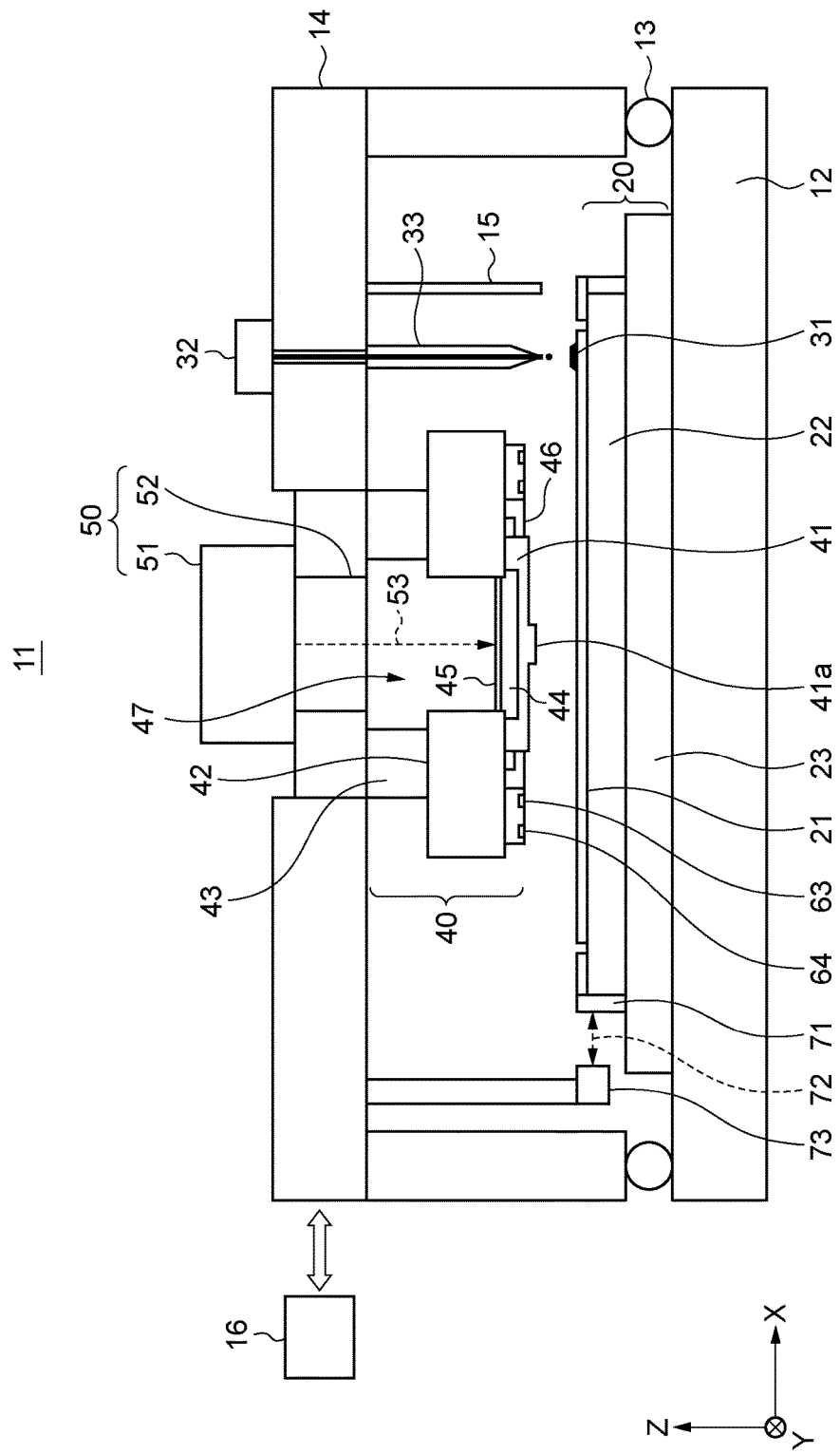
FIG. 1 is a diagram of an exemplary configuration of an imprint processor according to an embodiment.

FIG. 1 is a schematic diagram of an exemplary configuration of an imprint processor 11 according to an embodiment. The imprint processor 11 is used to manufacture an article, such as a semiconductor device. The imprint processor 11 is a device that molds resin 31 applied to a wafer (substrate) 21, serving as a substrate to be processed, with a mold 41 to form a pattern of the resin, serving as an imprint material, on the wafer 21. In the present embodiment, the imprint processor 11 uses a photo-curing method in which the imprint material is cured by irradiation with ultraviolet (UV) light. Any other method, such as a heat-curing method in which the imprint material is cured by heat input, may be used. In the figures, the Z axis or direction is identical to the optical axis of UV light 53 applied to the resin 31 on the wafer 21 and the X axis or direction and the Y axis or direction are orthogonal to each other in a plane perpendicular to the Z axis. The imprint processor 11 includes a photo-irradiation unit 50, a mold holder 40, a wafer holder 20, a droplet discharge unit 33, and a control unit 16.

The photo-irradiation unit 50 applies the UV light 53 to the mold 41 in imprint processing, particularly, when curing the resin 31 on the wafer 21. The photo-irradiation unit 50 includes a light source 51 that emits the UV light 53 for curing resin and an illumination optical system 52 that adjusts the UV light 53 to light suitable for imprint processing and applies the resultant light to the mold 41. The light source 51 may be a lamp, such as a halogen lamp. The light source 51 may be any light source emitting light that passes through the mold 41 and that has a wavelength at which the resin 31 is cured by irradiation with the UV light 53. Although not illustrated, the illumination optical system 52 may include a lens, a mirror, an aperture, and a shutter for switching between irradiation with light and shielding from light. Since the photo-curing method is used in the present embodiment, the photo-irradiation unit 50 is disposed. For example, if the heat-curing method is used, a heat source unit for curing thermosetting resin can be disposed instead of the photo-irradiation unit 50.

The mold 41 has a polygonal (rectangular or square) outer shape and includes a pattern portion 41a on its surface facing the wafer 21. The pattern portion 41a has a three-dimensional relief pattern, for example, a circuit pattern, to be transferred. The mold 41 is made of a material that permits the UV light 53 to pass therethrough. In the present embodiment, the mold 41 is made of quartz, for example. The mold 41 may have a cavity (recess) 44 in an irradiation surface to be irradiated with the UV light 53 such that the cavity 44 is circular in plan view and has a certain depth.

The mold holder 40 includes a mold chuck 42 that holds the mold 41, a mold driving mechanism 43 that movably holds the mold chuck 42, and a magnification correction mechanism 46 that corrects the shape of the mold 41 (the pattern portion 41a). The mold chuck 42 can hold the mold 41 by attracting an outermost area of the irradiation surface, which is to be irradiated with the UV light 53, of the mold 41 with vacuum suction force or electrostatic force. For example, to hold the mold 41 with vacuum suction force, the mold chuck 42 is connected to a vacuum pump (not illustrated) disposed outside. Attraction pressure of the mold chuck 42 can be appropriately controlled by evacuation of the vacuum pump, thus controlling attraction force (holding force) applied to the mold 41. The mold driving mechanism 43 moves the mold 41 in each axial direction to selectively bring the mold 41 into contact with the resin 31 on the wafer 21 (pressing with the mold) or separate the mold from the cured resin (releasing the mold). Examples of power sources usable in the mold driving mechanism 43 include a linear motor and an air cylinder. The mold driving mechanism 43 may include a plurality of driving systems, such as a coarse-motion driving system and a fine-motion driving system, to position the mold 41 with high accuracy. The mold driving mechanism 43 may have a function of adjusting the position of the mold 41 not only in the Z direction but also in the X and Y directions or in a θ direction (rotation about the Z axis) and a tilt function of correcting the tilt of the mold 41. Although the above-described pressing and releasing operations in the imprint processor 11 may be achieved by moving the mold 41 in the Z direction, these operations may be achieved by moving the wafer holder 20 in the Z direction. The operations may be performed by moving the mold 41 and the wafer holder 20 relative to each other. The magnification correction mechanism 46 is included in the mold chuck 42 such that the magnification correction mechanism 46 is disposed in part for holding the mold 41. The magnification correction mechanism 46 applies external force to, or mechanically displaces side surfaces of the mold 41 to correct the shape of the mold 41 (the pattern portion 41a).

Each of the mold chuck 42 and the mold driving mechanism 43 has a light-passing area 47 in its central (inner) part in a planar direction. The light-passing area 47 enables the UV light 53 emitted from the photo-irradiation unit 50 to pass therethrough to the wafer 21. The mold chuck 42 (or the mold driving mechanism 43) includes a light-transmissive member (e.g., a glass plate) 45 that defines the cavity 44 surrounded by part of the light-passing area 47 and the mold 41 as a closed space. In this case, a pressure inside the cavity 44 is regulated by a pressure regulator (not illustrated) including a vacuum pump. For example, when the mold 41 is pressed against the resin 31 on the wafer 21, the pressure regulator sets a pressure inside the cavity 44 to a value higher than a pressure outside the cavity 44. Thus, the pattern portion 41a is deformed such that the pattern portion 41a protrudes toward the substrate 21. Consequently, central part of the pattern portion 41a can be first brought into contact with the resin 31. This eliminates or reduces a likelihood that gas (air) may remain between the pattern portion 41a and the resin 31, so that the relief pattern of the pattern portion 41a can be completely filled with the resin 31.

A gas supply device 63 and a gas recovery device 64 (also referred to as a supply and recovery head, or simply a head) are arranged in the mold holder 40 or in the vicinity thereof. A gas supply and recovery mechanism, which will be described later, allows the gas supply device 63 to supply gas to a space between the pattern portion 41a and the wafer 21, and allows the gas recovery device 64 to recover the supplied gas. In this case, the gas is a condensable gas having a property of being liquefied due to an increase in pressure caused by pressing. For example, pentafluoropropane is used. Typically, pentafluoropropane has a boiling point within a range from −10° C. to 23° C. and has a saturated vapor pressure within a range from 0.1 MPa to 0.4 MPa. Replacing the air in the space between the pattern portion 41a and the wafer 21 with the condensable gas can prevent an unfilled defect from being caused by the air remaining between the pattern portion 41a and the wafer 21.

Examples of the wafer 21 include a monocrystalline silicon substrate and a silicon-on-insulator (SOI) substrate. The pattern portion 41a is used to form patterns (or a layer including the patterns) of the resin 31 in a plurality of shots (pattern formation regions) on the wafer 21. Typically, patterns (hereinafter, referred to as "substrate-side patterns") are formed in the shots by wafer processing prior to loading the wafer 21 into the imprint processor 11.

The wafer holder 20 movably holds the wafer 21. For example, before the mold 41 is pressed against the resin 31 on the wafer 21, the wafer holder 20 aligns the pattern portion 41*a* with a shot (substrate-side pattern). The wafer holder 20 includes a wafer chuck 22 that holds the wafer 21 by attraction force and a wafer stage 23 that is movable in each axial direction while mechanically holding the wafer chuck 22. Examples of power sources usable in the wafer stage 23 include a linear motor and a planar motor. The wafer stage 23 may include a plurality of driving systems, such as a coarse-motion driving system and a fine-motion driving system, for each of the X and Y directions. The wafer stage 23 may further include a driving system for adjusting the position of the wafer 21 in the Z direction and have a function of adjusting the position of the wafer 21 in the θ direction and a tilt function of correcting the tilt of the wafer 21. The wafer holder 20 further includes a plurality of reference mirrors (reflectors) 71 on its side surfaces such that the reference mirrors 71 correspond to the X, Y, Z, ωX, ωY, and ωZ directions. The imprint processor 11 includes a plurality of laser interferometers 73 arranged in one-to-one correspondence to the reference mirrors 71. Each laser interferometer 73 applies a beam 72 to the corresponding reference mirror 71 to measure the position of the wafer stage 23. FIG. 1 illustrates only one combination of the reference mirror 71 and the laser interferometer 73. The laser interferometers 73 measure the position of the wafer 21 in real time. The control unit 16 controls positioning of the wafer 21 (the wafer stage 23) based on measurement values of the laser interferometers 73. Examples of a position measurement mechanism include an encoder using a semiconductor laser in addition to the above-described laser interferometer 73.

The droplet discharge unit 33 is disposed in the vicinity of the mold holder 40. The droplet discharge unit 33 applies the resin 31 to a shot (substrate-side pattern) on the wafer 21. In this case, the resin 31 is a UV-curable resin (photo-curable resin) that is curable by receiving the UV light 53. The kind of the resin 31 is appropriately selected in accordance with various conditions, such as semiconductor device manufacturing steps. The droplet discharge unit 33 uses an ink-jet method as an applying method, and includes a container 32 that contains the resin 31 in an uncured state. The droplet discharge unit 33 includes a piezo-actuated discharging mechanism (ink-jet head). An application amount (discharge amount) of the resin 31 to be applied can be regulated in a range of, for example, 0.1 to 10 pL/droplet. Typically, a discharge amount of approximately 2 pL/droplet is often used. The entire amount of resin 31 to be applied is determined based on the density of the pattern portion 41*a* and a target residual layer thickness. The droplet discharge unit 33 controls, for example, an application position and an application amount in accordance with an operation instruction from the control unit 16.

The control unit 16 can control operations and adjustments of the components of the imprint processor 11. The control unit 16 includes a computer and is connected to the components of the imprint processor 11 by lines. The control unit 16 can control the components of the imprint processor 11 in accordance with a program. The control unit 16 may be accommodated together with the components of the imprint processor 11 in a single housing or may be separated from the components of the imprint processor 11 such that the control unit 16 is accommodated in a different housing.

The imprint processor 11 further includes a base 12, a vibration isolator 13, a frame 14, and an alignment scope 15. The base 12 supports the whole of the imprint processor 11 and defines a reference plane for movement of the wafer stage 23. The vibration isolator 13 has a function of isolating the frame 14 from vibrations transmitted from a floor, and supports the frame 14. The frame 14 supports the components of the imprint processor 11 arranged above the wafer 21, namely, the light source 51, the mold 41, and the components arranged therebetween. The alignment scope 15 measures the position of an alignment mark on the wafer 21. The wafer stage 23 is positioned based on the measurement by the alignment scope 15.

Figure 2:
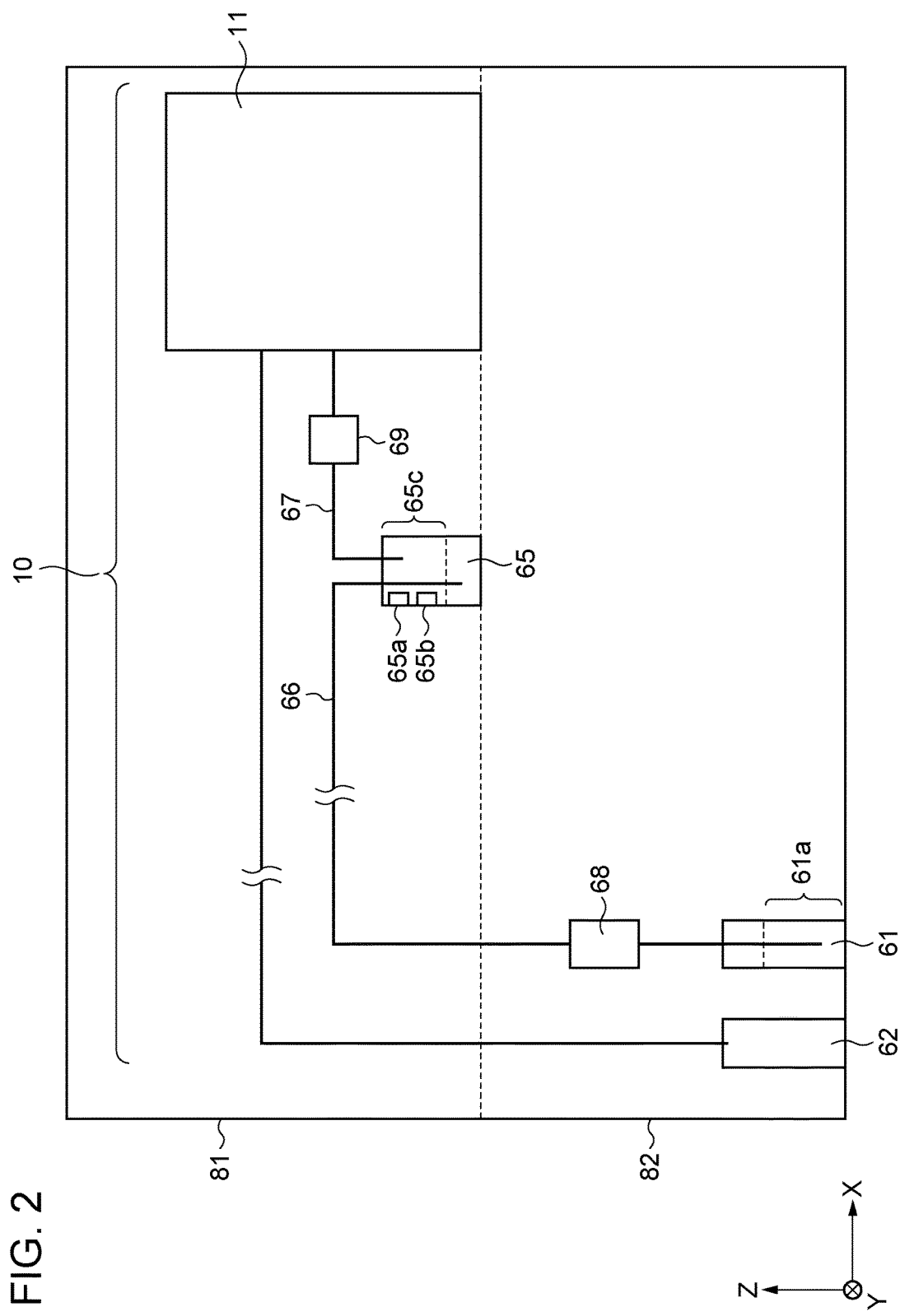
FIG. 2 is a diagram of an exemplary configuration of an imprint apparatus including a gas supply and recovery mechanism in the embodiment.

The supply and recovery of the condensable gas in the present embodiment will now be described. FIG. 2 illustrates an exemplary configuration of an imprint apparatus 10 including the imprint processor 11 and the gas supply and recovery mechanism that supplies the condensable gas to the imprint processor 11 and recovers the supplied gas. A gas container 61 stores the condensable gas in a liquid state. The gas container 61 is disposed in, for example, a gas container installation floor 82 (e.g., an outdoor space or a basement) different from a clean room floor 81 where the imprint processor 11 is disposed. A buffer tank 65 is disposed in the imprint processor 11 or in the vicinity thereof. The buffer tank 65 serves as a storage that receives the condensable gas in the liquid state from the gas container 61 and stores the received gas. The buffer tank 65 is disposed at a position higher than that of the gas supply device 63 in order to prevent the condensable gas from being liquefied in, for example, a gas supply pipe 67, which will be described later. The buffer tank 65 is connected to a liquid phase region 61*a* of the gas container 61 by a liquid supply pipe 66, so that the condensable gas in the gas container 61 can be transferred in the liquid state.

A filter 68 for filtering the condensable gas in the liquid state may be disposed in the liquid supply pipe 66. This allows the buffer tank 65 to store the condensable gas in a clean and liquid state. The filter 68 may include a plurality of filters to remove particles and metals. Thus, the condensable gas can be kept clean.

The gas supply device 63 in the imprint processor 11 is connected to a gas phase region 65*c* of the buffer tank 65 by the gas supply pipe 67. The gas supply pipe 67 allows the condensable gas vaporized in the buffer tank 65 to be introduced in a gas state to the gas supply device 63 in the imprint processor 11. In the imprint processor 11, as described above, the gas is supplied by the gas supply device 63 to the space between the pattern portion 41*a* and the wafer 21. When the condensable gas is vaporized in the buffer tank 65, the buffer tank 65 is cooled by vaporization heat, so that a sufficient amount of condensable gas in the gas state may fail to be obtained. To stably vaporize the condensable gas in the buffer tank 65, a temperature regulator 65*a* that regulates a temperature in the buffer tank 65 is disposed in the buffer tank 65. The temperature regulator 65*a* may be a mechanism for heating the buffer tank 65 by using a heater while measuring the temperature in the buffer tank 65 or a mechanism for regulating the temperature by causing a temperature-regulated liquid to flow. In addition, a liquid level sensor 65*b* that measures a liquid level of the condensable gas in the liquid state is disposed in the buffer tank 65. When the liquid level is lower than a set level, the condensable gas in the liquid state is supplied from the gas container 61 through the liquid supply pipe 66 to the buffer tank 65. Consequently, the buffer tank 65 stores a constant amount of condensable gas in the liquid state.

A flow rate controller 69 is disposed in the gas supply pipe 67. In the present embodiment, neither filter nor valve is disposed between the flow rate controller 69 and the gas supply device 63 because the condensable gas is prevented from being liquefied in the pipe. If the condensable gas in the gas state is reliquefied and left in the gas supply pipe 67 by an accident or the like, the condensable gas in the liquid state has to be removed. For this reason, the gas supply pipe 67 may include a T-shaped joint such that the pipe is divided into a plurality of pipe components and further include a mechanism for recovering the condensable gas in the liquid state. The recovered condensable gas in the liquid state can be recovered into a recovery container 62.

The condensable gas supplied to the imprint processor 11 is discharged to the outside of the imprint processor 11 through the gas recovery device 64 and is then recovered into the recovery container 62. The recovered condensable gas in the recovery container 62 can be transferred to the gas container 61 or the buffer tank 65 and be reused.

In the above-described configuration, the condensable gas is transferred in the liquid state from the gas container 61 to the buffer tank 65 through the liquid supply pipe 66 and is then transferred in the gas state from the buffer tank 65 to the imprint processor 11 through the gas supply pipe 67. In this case, the length of the gas supply pipe 67 through which the condensable gas is transferred in the gas state is reduced as much as possible, thus preventing the condensable gas from being liquefied in the pipe. Consequently, the condensable gas can be supplied at a stable flow rate. Furthermore, a component that has a high pressure loss, such as a filer, is disposed in the liquid supply pipe 66 where possible. Such a component is not disposed in the gas supply pipe 67. This reduces a pressure loss in the gas supply pipe 67, thus achieving stable supply of the condensable gas.

If the gas supply pipe 67 is long, a pressure loss in the gas supply pipe 67 may increase. This increases a likelihood that the condensable gas may be reliquefied in the gas supply pipe 67. To prevent the reliquefaction, the length, L, of the gas supply pipe 67 has to satisfy the following inequality:

$$Ps - P0 \geq \lambda \cdot (L/D) \cdot (\gamma V^2)/2 \quad (1)$$

where Ps denotes the saturated vapor pressure of the condensable gas in the gas supply pipe 67,
denotes the atmospheric pressure,
$\lambda$ denotes the friction coefficient of the gas supply pipe 67,
D denotes the inner diameter of the gas supply pipe 67,
$\gamma$ denotes the density of the gas in the gas supply pipe 67, and
V denotes the flow velocity of the condensable gas in the gas supply pipe 67.

Figure 3:
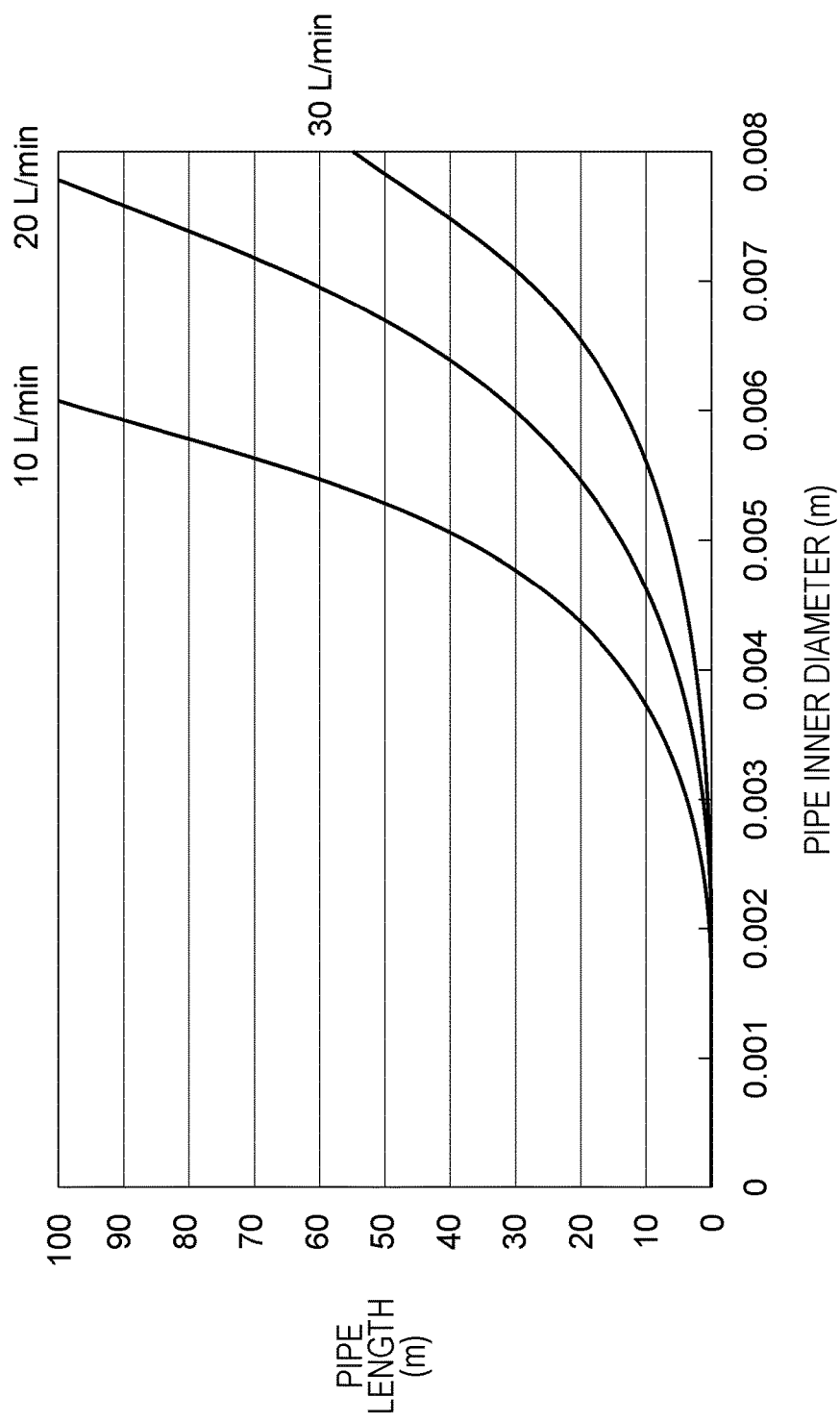
FIG. 3 is a graph illustrating pipe lengths at which a condensable gas can be transferred without being liquefied.

For example, when pentafluoropropane is used as a condensable gas, the pressure (Ps−P0) obtained by subtracting the atmospheric pressure from a vapor pressure at 23° C. is 40 kPa. This means that pentafluoropropane is liquefied under a pressure of 40 kPa. The right side of Inequality (1) is Fanning's equation and denotes a pressure loss in a horizontal pipe. FIG. 3 illustrates the pipe lengths L calculated based on gas flow rates of 10, 20, and 30 L/min and 40 kPa as the right side of Inequality (1). For example, it is assumed that the gas supply pipe 67 has an inner diameter of 0.006 m and pentafluoropropane is supplied to the imprint processor 11 at a flow rate of 30 L/min. In this case, as illustrated in FIG. 3, the gas would be liquefied in the gas supply pipe 67 and stable supply would fail unless the length of the gas supply pipe 67 is less than or equal to approximately 15 m. Similarly, assuming that the inner diameter of the gas supply pipe 67 is 0.004 m, the length thereof has to be less than or equal to approximately 2 m. Assuming that the length of the gas supply pipe 67 is 0.005 m, the length thereof has to be less than or equal to approximately 6 m. The larger the inner diameter of the gas supply pipe 67, the longer the gas supply pipe 67, and the larger the supply amount of pentafluoropropane. In terms of installation, however, the inner diameter of the gas supply pipe 67 is typically less than or equal to 0.006 m and the length thereof is set to 15 m or less. A reduction in supply amount of pentafluoropropane allows increase of the length of the gas supply pipe 67. However, the air in the space between the pattern portion 41a and the wafer 21 could not be sufficiently replaced with pentafluoropropane.

The above-described calculation results are based on pressure losses obtained on the assumption that the gas supply pipe 67 includes only horizontal pipe components. Actually, the gas supply pipe 67 is connected to, for example, the flow rate controller 69, a joint, and the gas supply device 63. Consequently, a pressure loss may increase. Furthermore, if the gas supply pipe 67 is bent for installation, a pressure loss may increase. The length of the gas supply pipe 67 at which the condensable gas is not liquefied is calculated in consideration of these pressure losses. In the use of pentafluoropropane as a condensable gas, the length of the gas supply pipe 67 obtained in consideration of the above-described pressure losses is less than or equal to 10 m. A linear distance (direct distance) between the imprint processor 11 and the buffer tank 65 is set to, for example, 5 m or less with consideration given to actual installation of the gas supply pipe 67.

The present embodiment provides the imprint apparatus in which a low vapor pressure condensable gas can be stably supplied to the imprint processor 11 and imprint processing can be achieved in an atmosphere of the condensable gas.

Method of Manufacturing Article

A method of manufacturing an article according to an embodiment of the present disclosure is suitable for manufacturing an article, such as a micro device (e.g., a semiconductor device) or an element having a fine structure. The method according to the present embodiment includes forming a pattern of an imprint material on a substrate using the above-described imprint apparatus (or subjecting the substrate to imprint processing) and processing the substrate with the formed pattern (or the substrate subjected to imprint processing). The method further includes other known steps (e.g., oxidation, film formation, deposition, doping, planarization, etching, resist removing, dicing, bonding, and packaging). The method according to the present embodiment is advantageous over related-art methods in at least one of performance, quality, productivity, and production cost of the article.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-219791 filed Nov. 9, 2015, which is hereby incorporated by reference herein in its entirety.

What is claimed is:

1. An apparatus that cures an uncured material on a substrate in a state of bringing a member and the uncured material into contact with each other, the apparatus comprising:

a gas supply device configured to supply a condensable gas to a space between the uncured material and the member, the condensable gas being liquefied by pressing;

a pipe for transferring the condensable gas in a gas state to the gas supply device; and a storage connected to the pipe, the storage storing the condensable gas in a liquid state, wherein the gas supply device is configured to supply the condensable gas vaporized in the storage and transferred through the pipe from the storage.

2. The apparatus according to claim 1, wherein the apparatus is configured to satisfy an inequality:

$$Ps-P0 \geq \lambda \cdot (L/D) \cdot (\gamma V^2)/2,$$

where Ps denotes a saturated vapor pressure of the condensable gas in the pipe, P0 denotes an atmospheric pressure, $\lambda$ denotes a friction coefficient of the pipe, D denotes an inner diameter of the pipe, $\gamma$ denotes a density of the condensable gas in the pipe, V denotes a flow velocity of the condensable gas in the pipe, and L denotes a length of the pipe.

3. The apparatus according to claim 1, further comprising:
a pipe for transferring the condensable gas in the liquid state to the storage.

4. The apparatus according to claim 3, further comprising:
a filter disposed in the pipe for transferring the condensable gas to the storage, the filter filtering the condensable gas in the liquid state.

5. The apparatus according to claim 1, further comprising:
a temperature regulator configured to perform temperature regulation in the storage.

6. The apparatus according to claim 1, wherein the storage is disposed at a position higher than that of the gas supply device.

7. The apparatus according to claim 1, further comprising:
a gas recovery device configured to recover the condensable gas supplied by the gas supply device to the space between the uncured material and the member; and
a container configured to contain the condensable gas recovered by the gas recovery device.

8. The apparatus according to claim 1, wherein the condensable gas has a boiling point within a range from $-10°$ C. to $23°$ C.

9. The apparatus according to claim 1, wherein the condensable gas has a saturated vapor pressure within a range from 0.1 MPa to 0.4 MPa.

* * * * *